(12) United States Patent
Cho

(10) Patent No.: US 6,680,736 B1
(45) Date of Patent: Jan. 20, 2004

(54) GRAPHIC DISPLAY SYSTEMS HAVING PAIRED MEMORY ARRAYS THEREIN THAT CAN BE ROW ACCESSED WITH 2($2^N$) DEGREES OF FREEDOM

(75) Inventor: Ho-yeol Cho, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/386,582

(22) Filed: Sep. 1, 1999

(30) Foreign Application Priority Data

Sep. 3, 1998 (KR) .............................................. 98-36291

(51) Int. Cl.[7] .............................................. G06F 13/14
(52) U.S. Cl. ........................ 345/519; 345/571; 711/102; 711/104; 711/105
(58) Field of Search .............................. 345/530, 519, 345/536, 547, 565, 567, 571; 711/102, 104, 105

(56) References Cited

U.S. PATENT DOCUMENTS

| | | | | |
|---|---|---|---|---|
| 4,569,036 A | * | 2/1986 | Fujii et al. ............. | 365/230.03 |
| 4,965,751 A | | 10/1990 | Thayer et al. ............. | 364/521 |
| 5,056,044 A | | 10/1991 | Frederickson et al. ...... | 364/521 |
| 5,270,973 A | * | 12/1993 | Guillemaud et al. ... | 365/189.02 |
| 5,394,170 A | | 2/1995 | Akeley et al. ............. | 345/189 |
| 5,517,609 A | | 5/1996 | Guillemaud et al. ........ | 395/162 |
| 5,539,696 A | * | 7/1996 | Patel .................... | 365/189.01 |
| 5,691,955 A | * | 11/1997 | Yamauchi .................. | 365/233 |
| 5,726,689 A | * | 3/1998 | Negishi et al. ............. | 345/430 |
| 5,793,685 A | * | 8/1998 | Suma ........................ | 365/201 |
| 5,812,466 A | * | 9/1998 | Lee et al. .................... | 365/200 |
| 5,815,168 A | | 9/1998 | May ............................ | 345/516 |
| 5,896,337 A | * | 4/1999 | Derner ....................... | 365/220 |
| 5,986,945 A | * | 11/1999 | Zheng ................... | 365/189.05 |
| 5,991,186 A | * | 11/1999 | Balistreri et al. ............. | 365/78 |
| 6,510,098 B1 | * | 1/2003 | Taylor ................... | 365/230.05 |

FOREIGN PATENT DOCUMENTS

KR 97-71790 11/1997

* cited by examiner

*Primary Examiner*—Matthew C. Bella
*Assistant Examiner*—Mackly Monestime
(74) *Attorney, Agent, or Firm*—Myers Bigel Sibley & Sajovec

(57) ABSTRACT

A semiconductor memory device of a high degree of freedom in column and a graphics display system using the semiconductor memory device as a mapping memory are provided. The semiconductor memory device according to the present invention is comprised of a plurality of memory arrays and each memory array is comprised of a plurality of memory cell groups. A plurality memory cell groups in each memory array are independently selected according to the information of a separate column address. Column decoders select the column of a corresponding memory array in response to common column addresses and first or second separate column addresses. The first or the second separate column addresses select one memory cell group among memory cell groups in each memory array. The common column addresses select predetermined numbers of columns in each memory cell group.

5 Claims, 5 Drawing Sheets

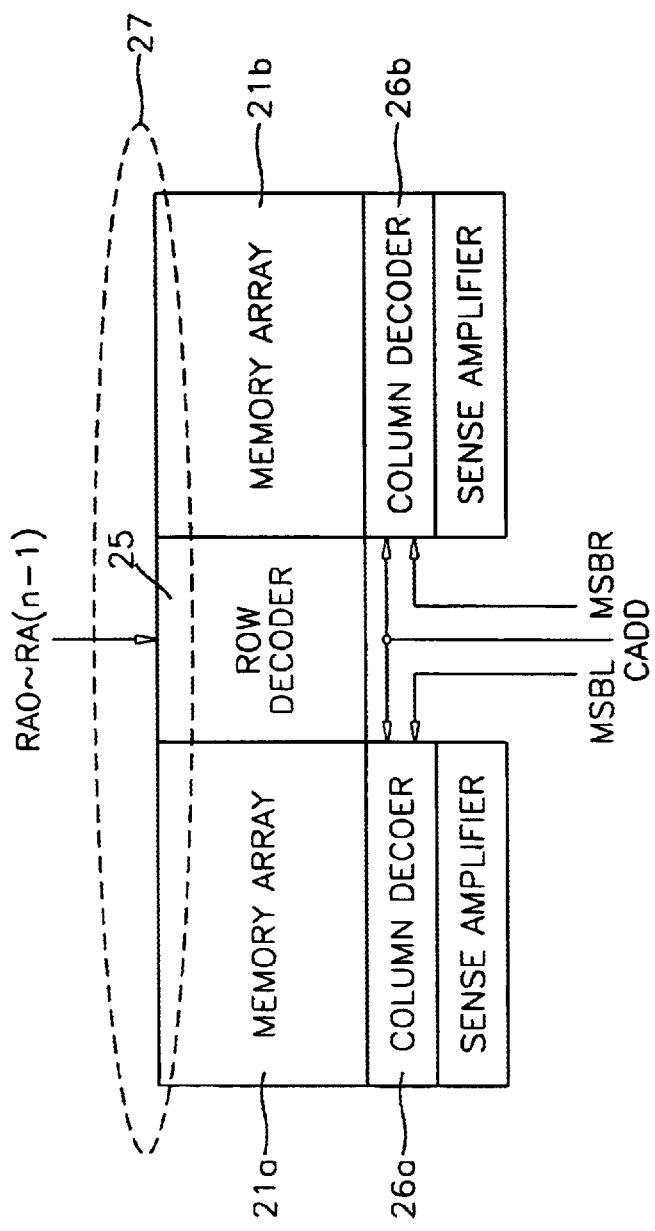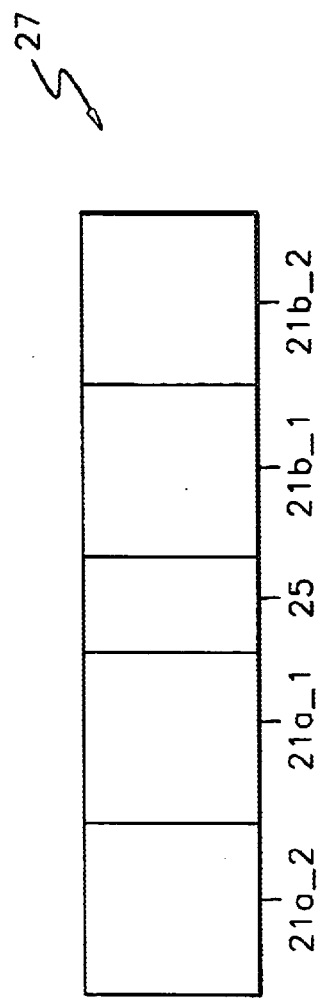
FIG. 3
FIG. 4

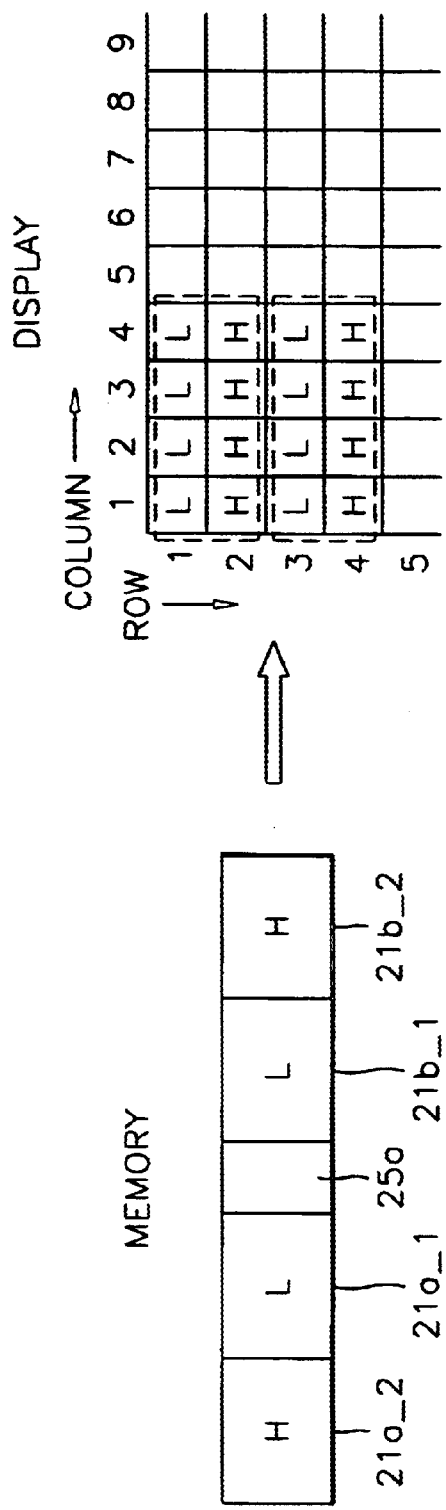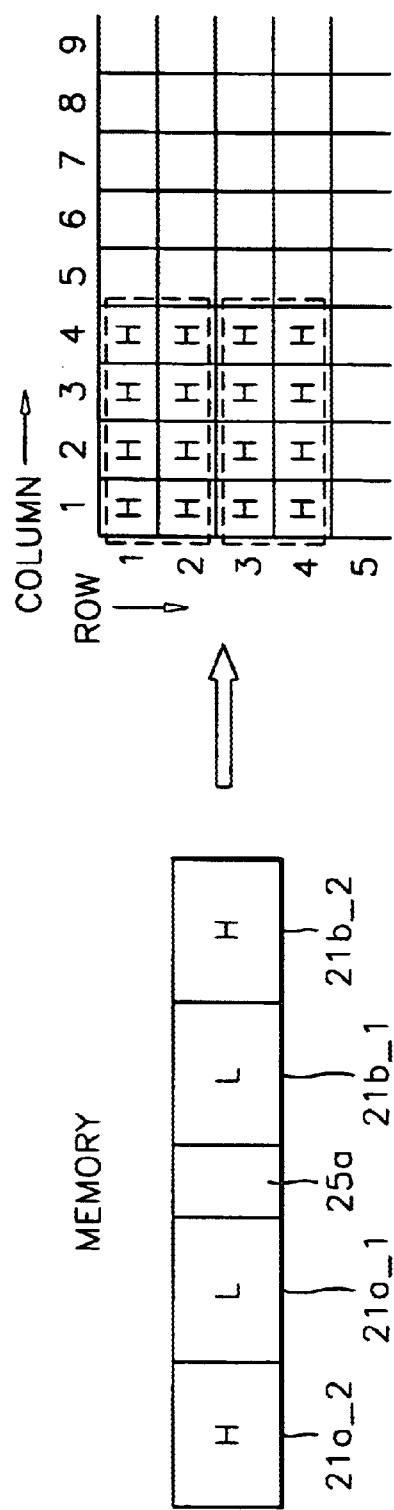
FIG. 5C
FIG. 5D

GRAPHIC DISPLAY SYSTEMS HAVING PAIRED MEMORY ARRAYS THEREIN THAT CAN BE ROW ACCESSED WITH $2(2^N)$ DEGREES OF FREEDOM

BACKGROUND OF THE INVENTION

1. Field of the Invention

The present invention relates to a semiconductor memory device, and more particularly, to a semiconductor memory device applied to a graphics display system.

2. Description of the Related Art

A graphics display system shows and transmits information to a user through digital images. The images are characters, numbers, graphs, and pictures. In many applications, the digital images are transmitted to users by a display device such as a raster scan video monitor and a printer. The images are stored as digital data in a storing apparatus, i.e., a mapping memory and are shown on a display by a certain manipulation.

Therefore, a mapping memory for storing the data of the display is necessary in the graphics display system. Mapping process is necessary for expressing the data stored in a digital type as an image on the display. The data of a predetermined memory cell of the mapping memory is processed as the image in a predetermined byte on the display by the mapping.

A drade-off is generated between the performance/speed of a microprocessor for generating data shown on the video display and the read/write time of the memory. Therefore, such elements must be considered in the application of the graphics display system. Other elements considered are the width and height of the display, the size of RAM, and the center direction of a system, i.e., line oriented or tile oriented.

Suppliers of devices used in such an application manufacture devices having various selection types. Accordingly, designers and users can use the various types of devices for various purposes.

The line oriented graphics display system generates and stores data according to a sequential order so that a line is displayed on the display one by one. Namely, the writing of data into the mapping memory and the reading of data from the mapping memory to the display are performed by one bit and by one line. The display of the tile oriented graphics display system is divided grids having the same sizes and shapes, called tiles. The size and shape of the tiles are one among the elements selected by system designers and users. For example, the tiles can be square or rectangle. Since the tile oriented graphics display system simultaneously refreshes a screen, it has an advantage in respect to an operation speed. Namely, the refresh efficiency is improved by processing a plurality of data bits as a pack. The mapping memory which can simultaneously input and output many items of data are required for performing the tile oriented display and mapping. The tile oriented graphic display system is not so widely applied due to the restriction of the number of pads which can be loaded in a conventional semiconductor memory device.

However, a merged memory with logic in which a semiconductor memory device and a logic circuit are realized in a chip was recently developed. Accordingly, the restriction of the number of the pads of the semiconductor memory device is somewhat relaxed.

A conventional semiconductor memory device is constructed to be suitable for the line oriented graphics display system. Namely, the conventional semiconductor memory device is designed so that a row is accessed and maintained when a plurality of columns are selected. Such an operation mode is called a page mode. The operation of the page mode improves the entire operation speed of the semiconductor memory device. When all the columns arranged along an array are accessed when a row is accessed, 50 through 70 percent of access time is reduced.

In the tile oriented graphics display system, the data stored in the mapping memory is shown on the display in units of a pixel formed of a byte of a plurality of rows and a plurality of columns. Therefore, the semiconductor memory device having a high degree of freedom which can simultaneously process data of a plurality of lines and a plurality of columns is used as the mapping memory for the tile oriented graphics display system.

However, such a conventional semiconductor memory device has a structure in which a column address is changed and data is accessed in a row. Therefore, the conventional semiconductor memory device is suitable for the line oriented graphics display system. However, the conventional semiconductor memory device lowers a speed efficiency in the tile oriented graphics display system.

SUMMARY OF THE INVENTION

To solve the above problem(s), it is an object of the present invention to provide a semiconductor memory device having a high degree of freedom in the selection of columns, thus being suitable for a tile oriented graphics display system.

It is another object of the present invention to provide a mapping apparatus using the semiconductor memory device.

To achieve the first objective, there is provided a semiconductor memory device having a multi-bit operation mode for simultaneously inputting and outputting $2m$ (m is a natural number) items of data, comprising a first memory array including a plurality of memory cell groups for inputting/outputting m items of first data in the multi-bit operation mode and a second memory array including a plurality of memory cell groups for inputting/outputting m items of second data in the multi-bit operation mode, wherein the rows of the plurality of memory cell groups of the first memory array and the rows of the plurality of memory cell groups of the second memory array are selected by the same row address and the columns of the plurality of memory cell groups of the first memory array and the columns of the plurality of memory cell groups of the second memory array are independently selected.

To achieve the second objective, there is provided a graphics display system, comprising a display showing an image of a title structure comprised of a plurality of pixels, a mapping memory for mapping an image by supplying data to the display and storing the image shown in the display as data and a mapping controlling portion for calculating mapping addresses and mapping coefficients identical to the data of the pixel on the display and providing the mapping addresses and the mapping coefficients to the display, wherein the mapping memory comprises a first memory array including a plurality of memory cell groups for inputting/outputting m items of first data in a multi-bit operation mode and a second memory array including a plurality of memory cell groups for inputting/outputting m items of second data in the multi-bit operation mode, wherein the rows of the plurality of memory cell groups of the first memory array and the rows of the plurality of memory cell groups of the second memory array are selected in the same row address and the columns of the plurality of memory cell groups of the first memory array and the columns of the plurality of memory cell groups of the second memory array are independently selected.

According to the semiconductor memory device of the present invention, the degree of freedom of the columns becomes higher. In the graphics display system using the semiconductor memory device as the mapping memory, the number of changes of the row address is minimized, thus all the tiles perform image processing. Accordingly, it is possible to minimize time for refreshing the tile oriented display.

BRIEF DESCRIPTION OF THE DRAWINGS

The above objects and advantages of the present invention will become more apparent by describing in detail a preferred embodiment thereof with reference to the attached drawings in which:

FIG. 3 shows the core of a semiconductor memory device used as the mapping memory of FIG. 1;

FIG. 4 is a magnified view of the part marked with a dotted line in FIG. 3; and

FIGS. 5A through 5D shows a concept of performing mapping on a display using a semiconductor memory device according to the present invention.

DESCRIPTION OF THE PREFERRED EMBODIMENTS

The attached drawings showing a preferred embodiment of the present invention and the contents described in the attached drawings must be referred to in order to fully understand the present invention, the advantage of the operation of the present invention, and the object achieved by performing the present invention.

Hereinafter, the present invention will be described in detail by describing the preferred embodiment of the present invention with reference to the attached drawings. In the respective drawings, the same reference signals denote the same members.

Figure 1:
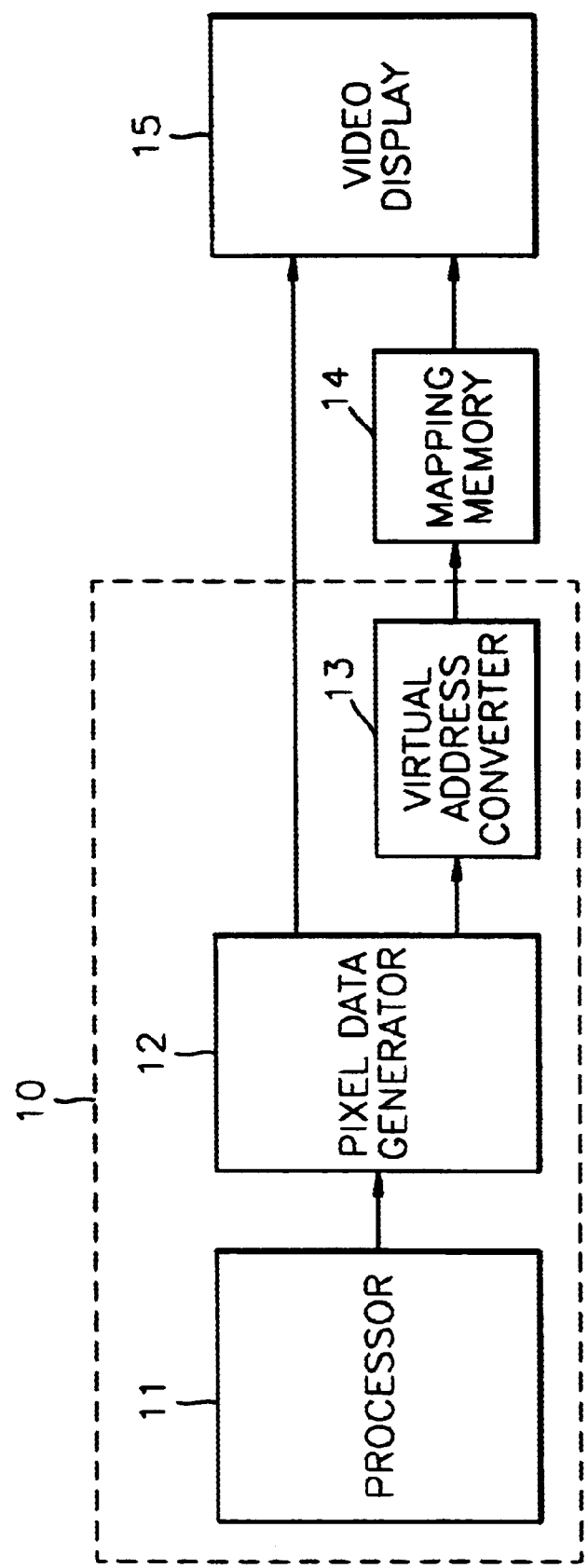
FIG. 1 is a block diagram showing an embodiment of a mapping apparatus.

FIG. 1 is a block diagram showing an embodiment of a mapping apparatus. Referring to FIG. 1, a graphics display system according to the present invention includes a mapping controlling portion 10, a mapping memory 14, and a display 15.

The mapping controlling portion 10 includes a microprocessor 11, a pixel data generator 12, and a virtual address converter 13.

The microprocessor 11 divides the edges of the polygon of a given picture into left edges and right edges, makes the edges identical to the edges of the mapping data on a texture surface, and divides the edges of the mapping data into the left edges of the mapping data and the right edges of the mapping data. The microprocessor 11 calculates virtual mapping addresses and virtual mapping coefficients at the edge point of the mapping data left edges and the mapping data right edges.

The pixel data generator 12 generates virtual mapping addresses and virtual mapping coefficients on a virtual mapping space identical to pixel data of the given picture and the information of the edges divided by the processor 11.

The virtual address converter 13 converts the virtual mapping addresses and the virtual mapping coefficients generated by the pixel data generator 12 into real mapping addresses.

The mapping memory 14 stores and outputs mapping data instructed by the real mapping data output from the virtual address converter 13. The video display 15 shows an image on a screen using address information from the pixel data generator 12 and data output from the mapping memory 14.

Figure 2:
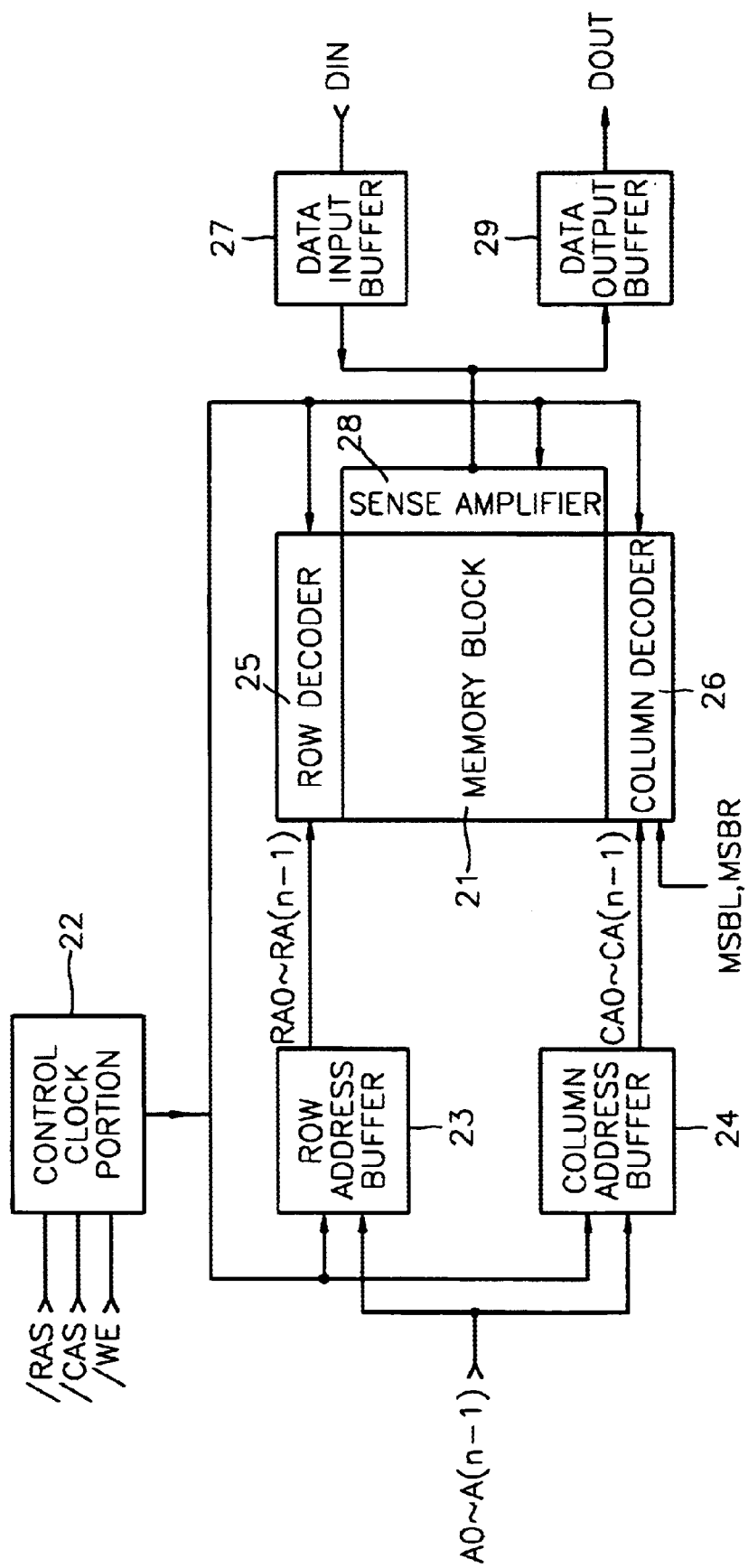
FIG. 2 is a block diagram showing the function of a semiconductor memory device used as a mapping memory of FIG. 1.

FIG. 2 is a block diagram showing the function of a semiconductor memory device used as the mapping memory of FIG. 1. Referring to FIG. 2, a memory block 21 has a plurality of memory cells (not shown) arranged on rows and columns. The data on the display 15 (refer to FIG. 1) is stored in the memory cells and the data output from the memory cells is shown on the display 15 as an image.

A control clock portion 22 provides signals for controlling circuits in the semiconductor memory device by combining a row address strobe (/RAS) signal, a column address strobe (/CAS) signal, and a write enable (/WE) signal, input from the outside of the semiconductor memory device.

A row address buffer 23 buffers addresses A0 through A(n−1) input from a row addressing section, i.e., a section in which the /RAS is activated and provides row addresses RA0 through RA(n−1).

A column address buffer 24 buffers the addresses A0 through A(n−1) input from a column addressing section, i.e., the /CAS is activated and provides column addresses CA0 through CA(n−1).

Row decoder 25 selects the row of the memory array 21 by the information of the row addresses RA0 through RA(n−1) provided from the row address buffer 23.

A column decoder 26 selects the column of the memory array 21 by the information of the column addresses CA0 through CA(n−1) provided by the column address buffer 24.

Therefore, a specific memory cell in the memory array 21 is selected by the row decoder 25 and the column decoder 26.

When the semiconductor memory device is in the write mode, namely, the /RAS, /CAS, and /WE are activated to low, a data input buffer 27 buffers input data DIN and provides the input data to the inside of the semiconductor memory device. In the write mode, a sense amplifier 28 sense and amplifies the input data DIN input through an input/output line (not shown) and writes data in a selected memory cell.

When the semiconductor memory device is in a read mode, namely, when the /RAS and /CAS are activated to low and the /WE maintains a high level, the sense amplifier 28 senses and amplifies the data of the selected memory cell and transfers the data to the input/output line (not shown). A data output buffer 29 buffers the data of the input/output line and outputs the data to the outside of the semiconductor memory device.

FIG. 3 shows the core of the semiconductor memory device used as the mapping memory of FIG. 1. FIG. 4 is a magnified view of the part 27 marked with a dotted line in FIG. 3. Let's assume that the semiconductor memory device according to the present invention has two memory arrays 21$a$ and 21$b$ respectively comprised of 2n rows and $2^{n-1}$ columns.

In general, one pixel of the graphics display system is comprised of eight bits in order to support 256 colors which are used. Let's assume that the semiconductor memory device according to the present invention performs 64 multi-bit operation which simultaneously outputs 64 items of data. Let's assume that the memory array 21a is comprised of two memory cell groups 21a_1 and 21a_2 and that the memory array 21b is comprised two memory cell groups 21b_1 and 21b_2 (refer to FIG. 4).

A row decoder 25 selects the rows of the memory arrays 21a and 21b by the information of the row addresses RA0 through RA(n−1) provided from the row address buffer 23 (refer to FIG. 2).

A column decoder 26a selects the column of the memory array 21a in response to common column addresses CADD and first separate column addresses MSBL.

A column decoder 26b selects the column of the memory array 21b in response to the common column addresses CADD and second separate column addresses MSBR.

The first separate column addresses MSBL select one memory cell group among the memory cell groups in the memory array 21a. The second separate column addresses MSBR select one memory cell group among the memory cell groups in the memory array 21b. The common column addresses CADD select predetermined numbers of columns in the respective memory cell groups.

In the present embodiment, (n−5) column addresses among the column addresses CA0 through CA(n−1) provided from the column address buffer 24 corresponds to the common column addresses CADD. Column addresses CA4 through CA(n−2) are preferably used as the common column addresses. In the multi-bit mode, the column address CA(n−i) is not performed on the decoding address. In the multi-bit mode, the first separate column addresses MSBL are input to the memory array 21a and the second separate column addresses MSBR are input to the memory array 21b. Column addresses CA0 through CA3 are not performed on decoding.

The first separate column addresses MSBL and the second separate column addresses MSBR are preferably most significant bit addresses.

Therefore, in the 64 multi-bit operation, 32 items of data are output from the memory cell group 21a_1 or the memory cell group 21a_2. Other 32 items of data are output from the memory cell group 21b_1 or the memory cell group 21b_2.

FIGS. 5A through 5D shows concepts of performing mapping on the display using the semiconductor memory device according to the present invention. Let's assume that the display according to the present embodiment is comprised of eight bits of data in one pixel.

Let's assume that "Low" data is stored in the memory cell group 21a_1 and that "high" data is stored in the memory cell group 21a_2. Let's assume that the "low" data is stored in the memory cell group 21b_1 and the "high" data is stored in the memory cell group 21b_2.

Let's assume that the data of the memory cell groups 21a_1 and 21a_2 is shown in bytes corresponding to odd rows and that the data of the memory cell groups 21b_1 and 21b_2 is shown in bytes corresponding to even rows.

Figure 5A:
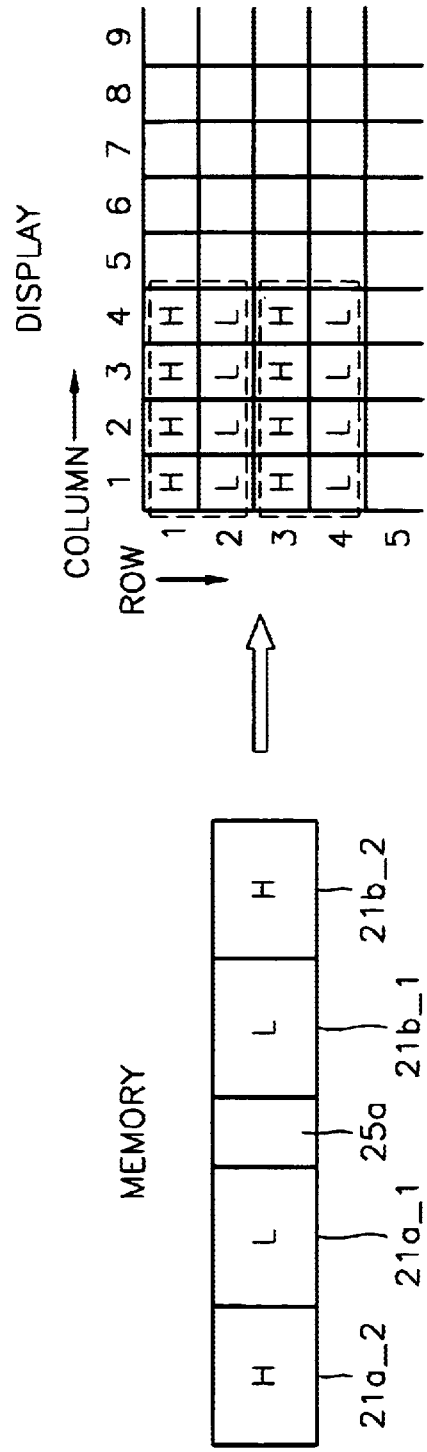

FIG. 5A is a view for explaining a case in which the "high" data is displayed as an image in bytes corresponding to the odd rows and the "low" data is displayed as an image in bytes corresponding to the even rows. In this case, the column of the memory cell group 21a_2 is selected in the memory array 21a. The data of the selected memory cell is displayed as a "high" image in the byte of second row. Therefore, the image of one pixel comprised of eight bytes is shown.

The "high" image is shown in a third row of the display and a "low" image is shown in a fourth row of the display by changing the row address of the display once. The number of changes of the row address is minimized by the above mapping method. Accordingly, all the tiles are image processed.

Figure 5B:
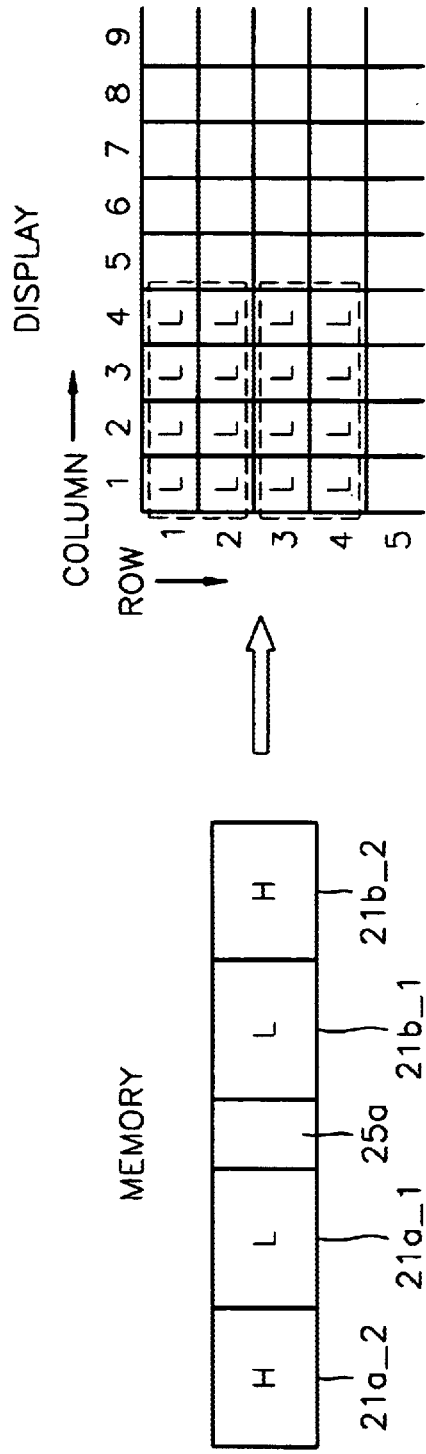

FIG. 5B describes a case in which the "low" data is displayed as an image in the bytes corresponding to all the odd and the even rows. In this case, the column of the memory cell group 21a_1 is selected in the memory array 21a. The data of the selected memory cell is displayed as the "low" image in the byte of a first row. The column of the memory cell group 21b_1 is selected in the memory array 21b. The data of the selected memory cell is shown as the "low" image in the byte of the second row.

The "low" images are displayed in the third and fourth rows of the display by changing the row address of the display once.

FIG. 5C describes a case in which the "high" data is displayed as the image in the bytes corresponding to the odd rows and the "low" data is shown as the image in the bytes corresponding to the even rows. In this case, the column of the memory cell group 21a_1 is selected in the memory array 21a. The data of the selected memory cell is shown as the "low" image in the byte of the first row. The column of the memory cell group 21b_2 is selected in the memory array 21b. The data of the selected memory cell is shown as the "high" image in the byte of the second row.

The "low" image is displayed in the third row of the display and the "high" image is displayed in the fourth row of the display by changing the row address of the display once.

FIG. 5D describes a case in which the "high" data is displayed as the image in the bytes corresponding to all the odd and the even rows. In this case, the column of the memory cell group 21a_2 is selected in the memory array 21a. The data of the selected memory cell is displayed as the "high" image in the byte of the first row. The column of the memory cell group 21b_2 is selected in the memory array 21b. The data of the selected memory cell is displayed as the "high" image in the byte of the second row.

The "high" image is displayed in the third and fourth rows of the display by one change in the row address of the display.

It is possible to remarkably improve the processing speed by performing the mapping using the semiconductor memory device according to the present invention as shown in FIGS. 5A through 5D. Let's assume that the tile of the display is comprised of 256 rows. When the conventional semiconductor memory device is used as the mapping memory, it is necessary to change the row address 255 times. However, when the semiconductor memory device according to the present invention is used as the mapping memory, all the tiles are image processed by changing the row address 127 times. It is possible to reduce the number of changes of the row address of the semiconductor memory device used as the mapping memory by reducing the number of the changes of the row address of the display.

Therefore, the image processing speed of the display of the tile oriented semiconductor memory device is remarkably improved by using the semiconductor memory device according to the present invention as the mapping memory.

The image process speed of the display becomes more remarkable by increasing the number of the memory array or the number of the memory cell groups.

The present invention is not restricted to the above embodiment, and it is clearly understood that many variations are possible within the scope and spirit of the present invention by anyone skilled in the art.

For example, in the present specification, the semiconductor memory device used as the mapping memory is comprised of two memory arrays and each memory array is comprised of two memory cell groups. Each memory cell group is decoded by one address.

However, the semiconductor memory device using the spirit of the present invention can be comprised of a plurality of memory arrays. Also, each memory array can be comprised of a plurality of memory cell groups. As the number of the memory cell groups increases, the number of the separate column addresses for decoding the memory cell group increases.

Therefore, the scope of the present invention must be defined by the spirit of the attached claims.

What is claimed is:

1. An integrated circuit memory device, comprising:

first and second memory arrays;

a row address decoder that is shared by said first and second memory arrays;

a first column decoder that is electrically coupled to said first memory array and is responsive to a first column address that comprises a plurality of common column address bits and at least a first column address bit; and a second column decoder that is electrically coupled to said second memory array and is responsive to a second column address that comprises the plurality of common column address bits and at least a second column address bit that is independently controllable relative to the at least a first column address bit; and wherein said first and second column decoders are configured to select one-half of said first and second memory arrays, respectively, in response to the at least a first column address bit and the at least a second column address bit, so that four possible groupings of output data are available from selected rows within said first and second memory arrays when the common column address bits are applied to said first and second column decoders during a read operation.

2. The device of claim 1, wherein the at least a first column address bit is a most significant bit of the first column address; and wherein the at least a second column address bit is a most significant bit of the second column address.

3. An integrated circuit memory device, comprising:

first and second memory arrays;

a row address decoder that is shared by said first and second memory arrays;

a first column decoder that is electrically coupled to said first memory array and is responsive to a first column address that consists of a plurality of common column address bits and $2^n$ first column address bits, where n is a non-negative integer; and a second column decoder that is electrically coupled to said second memory array and is responsive to a second column address that consists of the plurality of common address bits and $2^n$ second column address bits that can be independently asserted relative to the $2^n$ first column address bits; and wherein said first and second column decoders are configured to select $\frac{1}{2}^n$ of said first and second memory arrays, respectively, in response to the 2n first column address bits and the 2n second column address bits, so that 2n possible groupings of output data are available from selected rows within said first and second memory arrays when the common column address bits are applied to said first and second column decoders during a read operation.

4. A graphics display system, comprising:

a tile-oriented display;

a mapping controller that is configured to calculate mapping addresses and mapping coefficients and is further configured to provide the mapping addresses and the mapping coefficients to said tile-oriented display; and a mapping memory that is configured to supply image data to said tile-oriented display, said mapping memory comprising:

first and second memory arrays;

a row address decoder that is shared by said first and second memory arrays;

a first column decoder that is electrically coupled to said first memory array and is responsive to a first column address that comprises a plurality of common column address bits and at least a first column address bit; and a second column decoder that is electrically coupled to said second memory array and is responsive to a second column address that comprises the plurality of common column address bits and at least a second column address bit that is independently controllable relative to the at least a first column address bit; and wherein said first and second column decoders are configured to select one-half of said first and second memory arrays, respectively, in response to the at least a first column address bit and the at least a second column address bit, so that four possible groupings of output data are available from selected rows within said first and second memory arrays when the common column address bits are applied to said first and second column decoders during a read operation.

5. The system of claim 4, wherein the at least a first column address bit is a most significant bit of the first column address; and wherein the at least a second column address bit is a most significant bit of the second column address.

* * * * *